(12) United States Patent
Meugnier et al.

(10) Patent No.: US 10,179,647 B1
(45) Date of Patent: Jan. 15, 2019

(54) UNMANNED AERIAL VEHICLE

(71) Applicant: Fat Shark Technology SEZC, George Town (KY)

(72) Inventors: Jerome Meugnier, Shenzhen (CN); Gregory French, Shenzhen (CN); Allan Evans, George Town (KY)

(73) Assignee: Fat Shark Technology SEZC, George Town, Grand Cayman (KY)

( * ) Notice: Subject to any disclaimer, the term of this patent is extended or adjusted under 35 U.S.C. 154(b) by 0 days.

(21) Appl. No.: 15/684,814

(22) Filed: Aug. 23, 2017

Related U.S. Application Data

(63) Continuation-in-part of application No. 29/610,543, filed on Jul. 13, 2017, and a continuation-in-part of application No. 29/610,554, filed on Jul. 13, 2017.

(51) Int. Cl.
| | | |
|---|---|---|
| *B64C 39/02* | (2006.01) | |
| *B64D 47/08* | (2006.01) | |
| *H05K 7/14* | (2006.01) | |

(52) U.S. Cl.
CPC ............ *B64C 39/024* (2013.01); *B64D 47/08* (2013.01); *H05K 7/1417* (2013.01); *B64C 2201/024* (2013.01); *B64C 2201/108* (2013.01); *B64C 2201/127* (2013.01); *B64C 2201/146* (2013.01); *B64C 2201/165* (2013.01); *B64D 2221/00* (2013.01)

(58) Field of Classification Search
None
See application file for complete search history.

(56) References Cited

U.S. PATENT DOCUMENTS

| | | |
|---|---|---|
| D317,800 S | 6/1991 | Laursen |
| D458,892 S | 6/2002 | DeTore et al. |
| D472,382 S | 4/2003 | Larsen |
| 6,868,314 B1 | 3/2005 | Frink |
| D557,356 S | 12/2007 | Johnston et al. |
| D575,834 S | 8/2008 | Welch |
| D628,658 S | 12/2010 | Wurm |
| 7,962,252 B2 | 6/2011 | Shams et al. |

(Continued)

FOREIGN PATENT DOCUMENTS

| | | |
|---|---|---|
| EP | 2499890 B1 | 4/2014 |
| EP | 2937123 A1 | 10/2015 |

(Continued)

*Primary Examiner* — Clayton E. LaBalle
*Assistant Examiner* — Dennis Hancock
(74) *Attorney, Agent, or Firm* — Jacobsen IP Law

(57) ABSTRACT

Disclosed herein are unmanned aerial vehicles (UAVs). Some UAVs include a vertically-mounted printed circuit board (PCB). The UAVs have yaw, pitch, and roll axes. The UAVs comprise a plurality of propellers, each of the plurality of propellers configured to rotate about a respective one of a plurality of axes of rotation; a base assembly coupled to each of the plurality of propellers; and a PCB coupled to the base assembly. A surface of the PCB lies in a plane defined by the yaw axis and the roll axis, and no portion of the PCB intersects any axis of rotation of any propeller of the unmanned aerial vehicle. The PCB may have a non-rectangular shape, such as the shape of a shark. Some UAVs include a PCB comprising a mechanical feature configured to engage with a peripheral or a peripheral subassembly.

20 Claims, 8 Drawing Sheets

(56) References Cited

U.S. PATENT DOCUMENTS

| | | |
|---|---|---|
| D648,808 S | 11/2011 | Seydoux et al. |
| D648,809 S | 11/2011 | Seydoux et al. |
| D659,771 S | 5/2012 | Seydoux et al. |
| 8,201,773 B1 | 6/2012 | Durham et al. |
| 8,242,623 B2 | 8/2012 | Lucero et al. |
| 8,387,911 B2 | 3/2013 | Collette |
| D706,678 S | 6/2014 | Earon |
| D710,452 S | 8/2014 | Barajas et al. |
| 8,903,568 B1 | 12/2014 | Wang et al. |
| 8,991,758 B2 | 3/2015 | Earon |
| 9,004,396 B1 | 4/2015 | Colin et al. |
| 9,004,973 B2 | 4/2015 | Condon et al. |
| D729,694 S | 5/2015 | Earon |
| D730,244 S | 5/2015 | Earon |
| D731,002 S | 6/2015 | Phillips |
| 9,070,101 B2 | 6/2015 | Abhyanker |
| 9,096,314 B2 | 8/2015 | Brotherton-Ratcliffe et al. |
| D741,247 S | 10/2015 | Brody et al. |
| D741,751 S | 10/2015 | Klaptocz et al. |
| D741,779 S | 10/2015 | Hsiao et al. |
| D745,435 S | 12/2015 | Park et al. |
| 9,213,046 B2 | 12/2015 | Wang |
| 9,221,537 B2 | 12/2015 | Wang et al. |
| 9,221,539 B2 | 12/2015 | Christensen et al. |
| D747,775 S | 1/2016 | Colin et al. |
| 9,233,754 B1 | 1/2016 | Wang et al. |
| D751,025 S | 3/2016 | Howell et al. |
| D751,490 S | 3/2016 | Chen |
| D751,491 S | 3/2016 | Chen |
| D756,842 S | 5/2016 | Ashjaee |
| D759,764 S | 6/2016 | Lai |
| 9,376,208 B1 | 6/2016 | Gentry |
| D760,624 S | 7/2016 | Balaresque et al. |
| D760,638 S | 7/2016 | Beskar |
| D761,690 S | 7/2016 | Friesmuth |
| D761,920 S | 7/2016 | Fargeau et al. |
| D763,133 S | 8/2016 | Ketcher |
| D763,134 S | 8/2016 | Wang |
| D767,043 S | 9/2016 | Morrison |
| D768,539 S | 10/2016 | Lee |
| D768,540 S | 10/2016 | Ji et al. |
| D768,789 S | 10/2016 | Fargeau et al. |
| 9,457,901 B2 | 10/2016 | Bertrand et al. |
| D770,572 S | 11/2016 | Caubel et al. |
| D772,756 S | 11/2016 | Gambus et al. |
| D772,991 S | 11/2016 | Caubel et al. |
| D774,478 S | 12/2016 | Li |
| D774,941 S | 12/2016 | Lupashin et al. |
| D776,569 S | 1/2017 | Baruchin |
| D776,570 S | 1/2017 | Baruchin |
| D777,059 S | 1/2017 | Zhang et al. |
| D777,263 S | 1/2017 | Lavagen et al. |
| 9,550,400 B2 | 1/2017 | Hutson |
| D779,595 S | 2/2017 | Xiao |
| D780,062 S | 2/2017 | Wu et al. |
| D781,381 S | 3/2017 | Caubel et al. |
| D782,365 S | 3/2017 | Hung |
| D783,727 S | 4/2017 | Xiao |
| D784,201 S | 4/2017 | Goldy |
| D784,202 S | 4/2017 | Park |
| D784,854 S | 4/2017 | Huang et al. |
| 9,623,969 B2 | 4/2017 | Nelson |
| 9,630,714 B1 | 4/2017 | Gohl et al. |
| D785,541 S | 5/2017 | Du et al. |
| D785,717 S | 5/2017 | Xiao |
| D787,372 S | 5/2017 | Ketcher |
| D795,160 S | 8/2017 | Koppenwallner |
| D795,967 S | 8/2017 | Haley et al. |
| D798,961 S | 10/2017 | Li |
| D806,607 S | 1/2018 | Zhydanov |
| D807,292 S | 1/2018 | Suzuki |
| D807,823 S | 1/2018 | Suzuki |
| D809,970 S | 2/2018 | Zhou |
| D809,992 S | 2/2018 | Hu et al. |
| D809,993 S | 2/2018 | Tsukii |
| D810,621 S | 2/2018 | Sadek |
| D811,330 S | 2/2018 | Suzuki |
| D813,723 S | 3/2018 | Ahn et al. |
| D813,724 S | 3/2018 | Hu |
| 2008/0210809 A1 | 9/2008 | Arlton et al. |
| 2009/0283629 A1 | 11/2009 | Kroetsch et al. |
| 2011/0199735 A1* | 8/2011 | Kawabata ............. H05K 3/361 361/721 |
| 2014/0117149 A1 | 5/2014 | Zhou et al. |
| 2014/0332620 A1* | 11/2014 | Earon .................. B64C 39/024 244/13 |
| 2015/0051755 A1 | 2/2015 | Erhart et al. |
| 2015/0060606 A1 | 3/2015 | Wang et al. |
| 2015/0129711 A1 | 5/2015 | Caubel |
| 2015/0259066 A1 | 9/2015 | Johannesson et al. |
| 2015/0273351 A1 | 10/2015 | Condon et al. |
| 2016/0001883 A1* | 1/2016 | Sanz ........................ B64F 1/02 244/17.23 |
| 2016/0016674 A1 | 1/2016 | Zhao et al. |
| 2016/0130015 A1 | 5/2016 | Caubel et al. |
| 2016/0185454 A1* | 6/2016 | Hutson ................. B64C 39/024 244/17.23 |
| 2016/0272317 A1 | 9/2016 | Cho et al. |
| 2016/0291594 A1 | 10/2016 | Zhao et al. |
| 2016/0301916 A1 | 10/2016 | Zhang et al. |
| 2016/0304198 A1 | 10/2016 | Jourdan |
| 2016/0349746 A1 | 12/2016 | Grau |
| 2016/0351089 A1 | 12/2016 | Salem |
| 2016/0368597 A1 | 12/2016 | Medlock |
| 2017/0006148 A1 | 1/2017 | Zhao |
| 2017/0021915 A1 | 1/2017 | Vaughn et al. |
| 2017/0026626 A1 | 1/2017 | Wang |
| 2017/0027077 A1 | 1/2017 | Nicoloff |
| 2017/0034493 A1 | 2/2017 | Wang |
| 2017/0034771 A1 | 2/2017 | Woodman et al. |
| 2017/0041507 A1 | 2/2017 | Chen et al. |
| 2017/0043869 A1* | 2/2017 | Howard ................ B64C 39/024 |
| 2017/0059704 A1 | 3/2017 | Xie et al. |
| 2017/0064068 A1 | 3/2017 | Liu et al. |
| 2017/0078553 A1 | 3/2017 | Sron et al. |
| 2017/0084181 A1 | 3/2017 | Wilson et al. |
| 2017/0094792 A1 | 3/2017 | Dunkel et al. |
| 2017/0121034 A1 | 5/2017 | Fisher et al. |
| 2017/0129601 A1 | 5/2017 | Babel et al. |
| 2017/0133771 A1 | 5/2017 | Xiao et al. |
| 2017/0163896 A1* | 6/2017 | Kang ................. H04N 5/23287 |
| 2017/0192093 A1* | 7/2017 | Yeh ..................... G01S 15/93 |
| 2017/0322563 A1* | 11/2017 | Kohstall ................. G05D 1/12 |

FOREIGN PATENT DOCUMENTS

| | | |
|---|---|---|
| EP | 2965989 A1 | 1/2016 |
| WO | 2013029286 A1 | 3/2013 |
| WO | 2015036907 A1 | 3/2015 |
| WO | 2016058120 A1 | 4/2016 |
| WO | 2016161426 A1 | 10/2016 |
| WO | 2016190994 A1 | 12/2016 |
| WO | 2016193884 A1 | 12/2016 |
| WO | 2017076079 A1 | 5/2017 |

\* cited by examiner

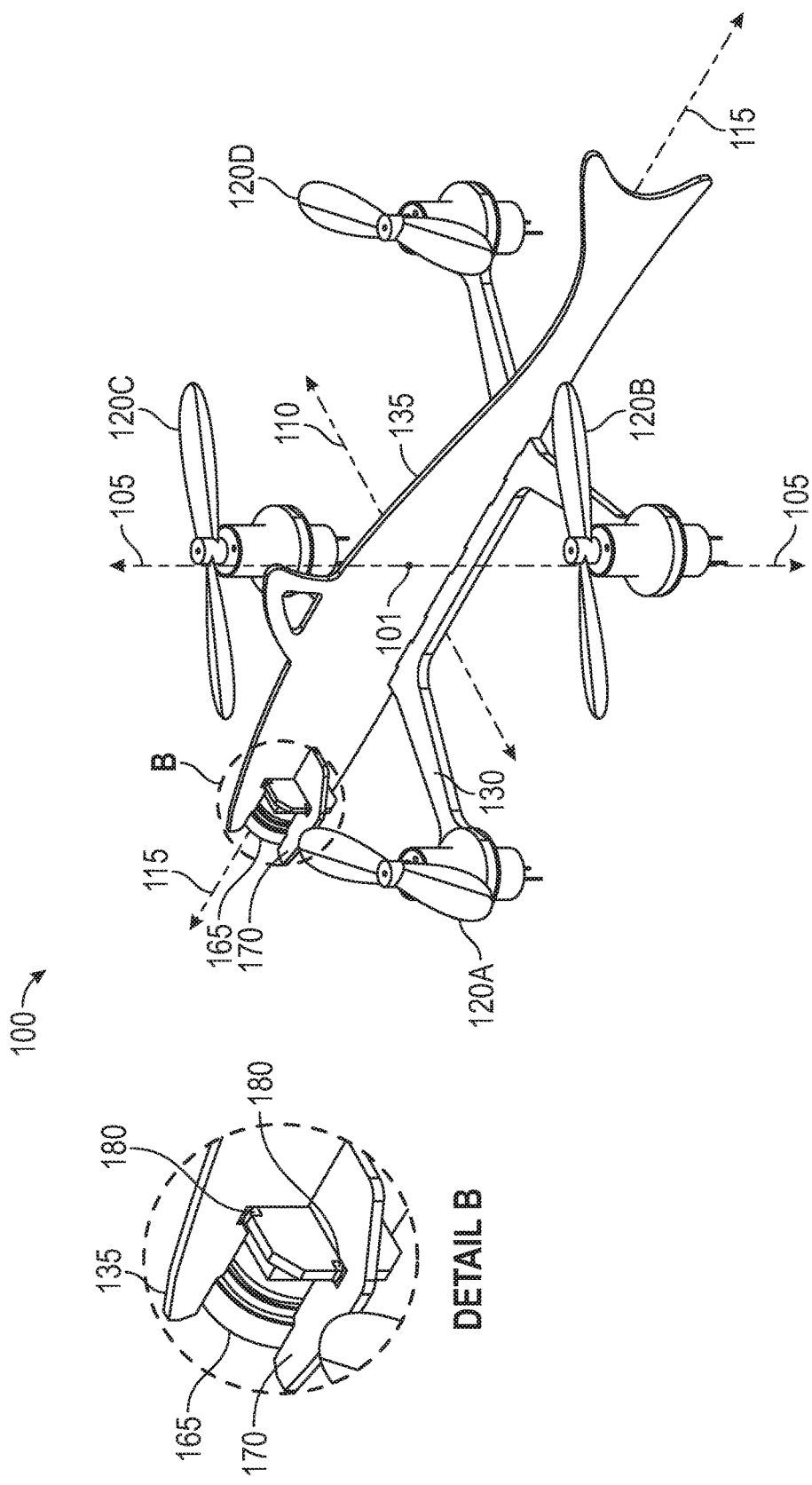

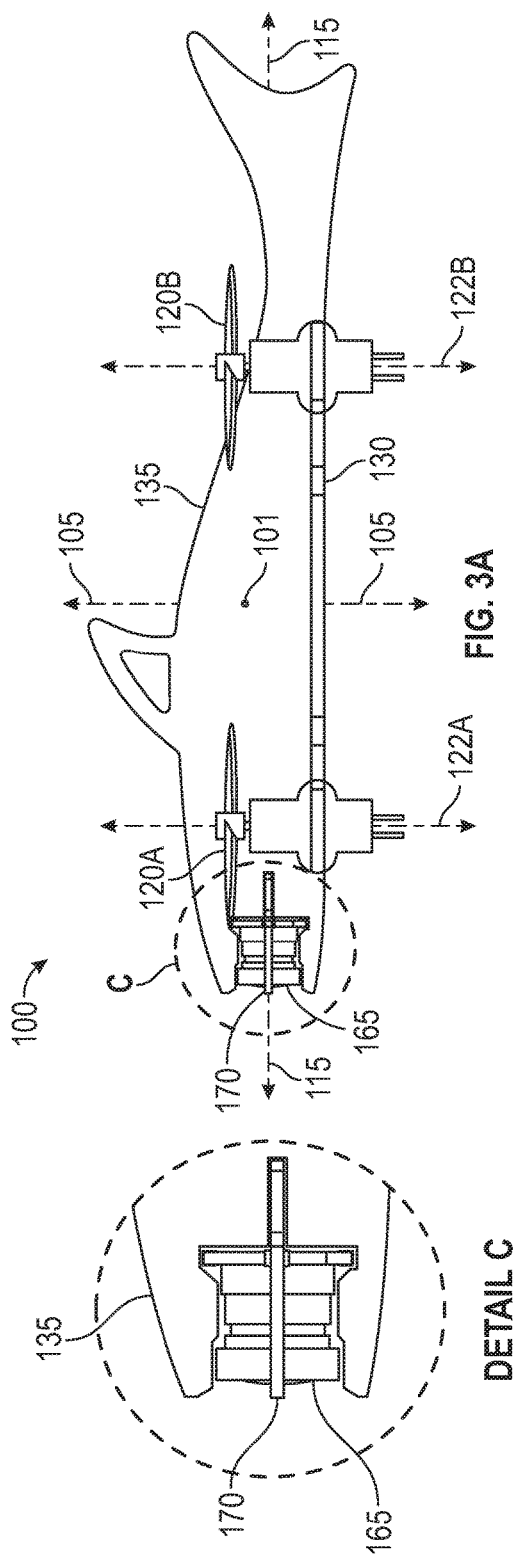
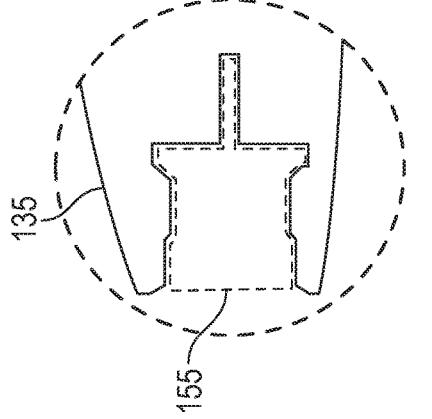
FIG. 3A
FIG. 3B
DETAIL C

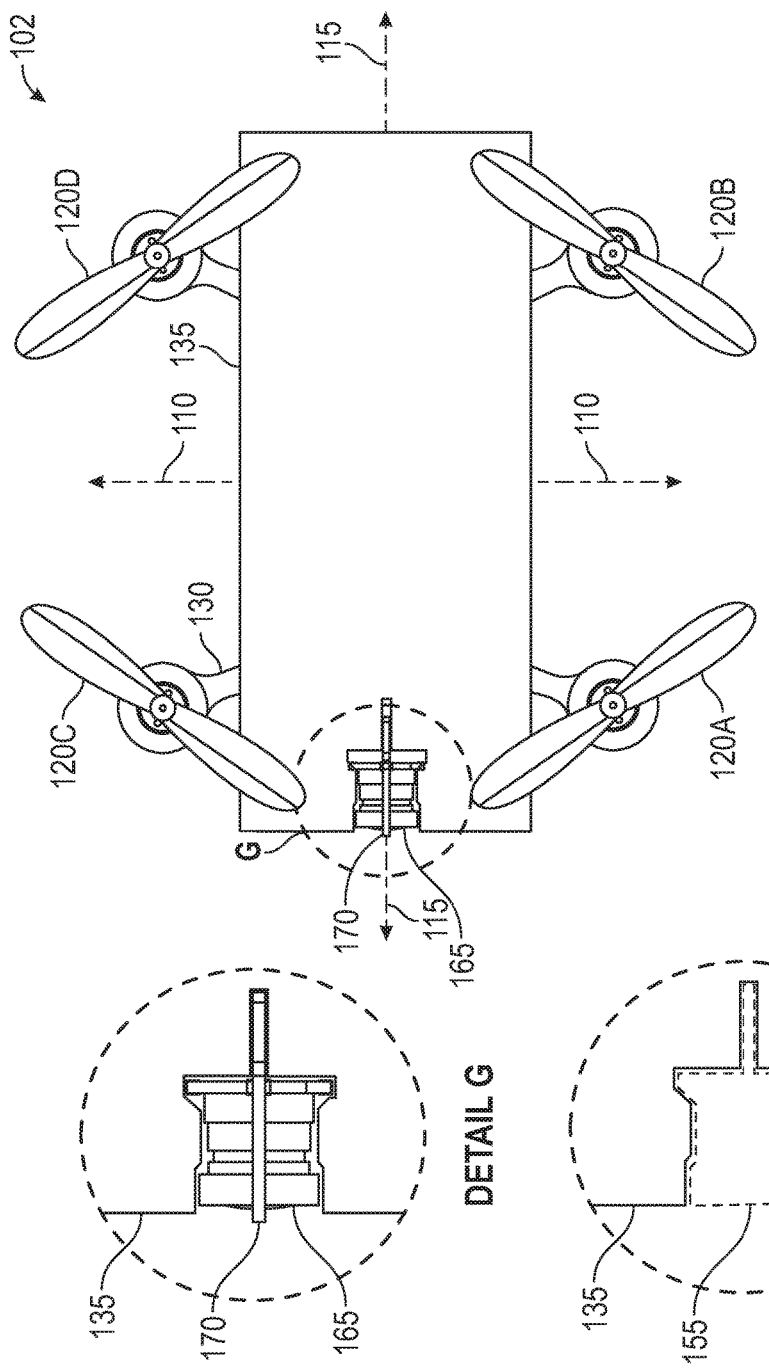

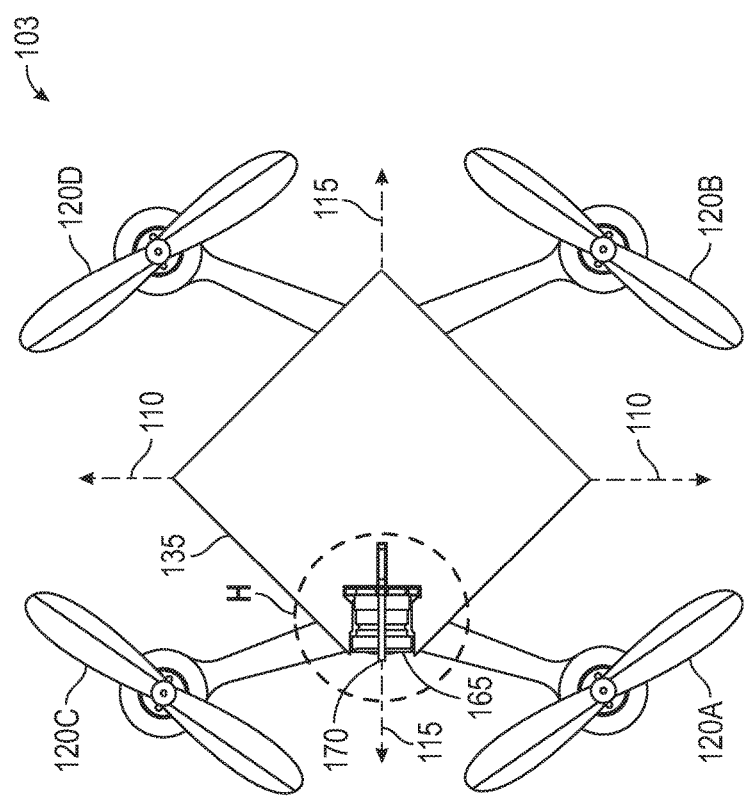
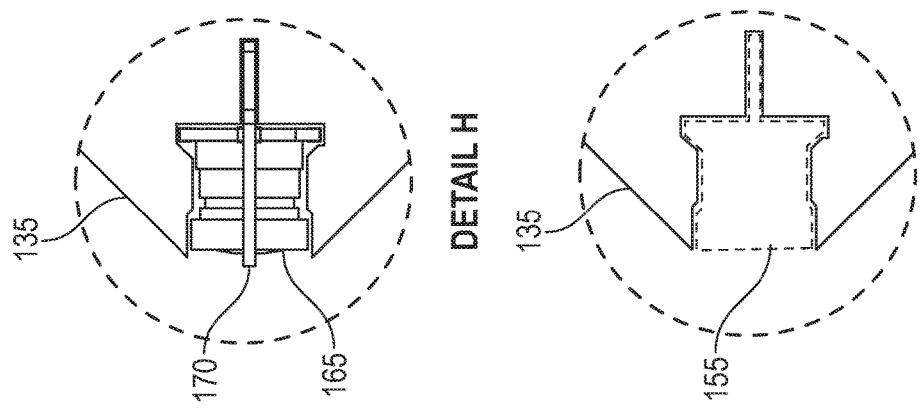

UNMANNED AERIAL VEHICLE

CROSS-REFERENCE TO RELATED APPLICATIONS

This application claims the benefit of, and hereby incorporates by reference the contents of, U.S. Design Patent Application Nos. 29/610,543, filed Jul. 13, 2017 and entitled "UNMANNED AERIAL VEHICLE," and 29/610,554, filed Jul. 13, 2017 and entitled "PRINTED CIRCUIT BOARD."

SUMMARY

Disclosed herein are embodiments of unmanned aerial vehicles having vertically-mounted printed circuit boards. In some embodiments, an unmanned aerial vehicle (UAV), which has a yaw axis, a pitch axis, and a roll axis, comprises a plurality of propeller assemblies (e.g., four propeller assemblies), a base assembly coupled to each of the plurality of propeller assemblies, and a printed circuit board (PCB) coupled to the base assembly. Each of the plurality of propeller assemblies is configured to rotate about a respective one of a plurality of axes of rotation. A surface of the PCB lies in a plane defined by the yaw axis and the roll axis, and no portion of the PCB intersects any axis of rotation of any of the propeller assemblies of the UAV.

In some embodiments, the plane in which the surface of the PCB lies is a first plane, and the surface of the PCB does not intersect any projection, in a second plane, of a rotation circumference of any propeller assembly of the unmanned aerial vehicle, the second plane being orthogonal to the axis of rotation of the propeller assembly.

In some embodiments, at least a portion of the surface of the PCB is exposed. In some embodiments, at least a portion of the surface of the PCB is covered by a coating, which may be transparent or translucent.

In some embodiments, the PCB has a nonrectangular shape. The nonrectangular shape may be any shape, such as, for example, the shape of an animal (e.g., a shark, a whale, a dog, a cat, a tiger, a fish, etc.). The PCB shape may provide an interesting design element to the UAV.

In some embodiments, the PCB comprises a mechanical feature configured to engage with a peripheral or a subassembly comprising the peripheral. For example, the mechanical feature may be a cutout in the PCB. In some such embodiments, the peripheral or peripheral subassembly may be slidably engaged in the cutout. In embodiments in which the peripheral or peripheral subassembly is slidably engaged in the cutout, the peripheral may be electrically coupled (e.g., connected) to the PCB. In some embodiments, the peripheral or peripheral subassembly is soldered to the PCB. The peripheral may be, for example, a camera.

In some embodiments, the UAV weighs less than about 1 kilogram (kg). For example, in some embodiments, the UAV is a micro-drone weighing no more than approximately 250 grams (g).

Some embodiments disclose a kit for a UAV that, after being assembled, has a yaw axis, a pitch axis, and a roll axis. The kit comprises four propeller assemblies, a base assembly configured to be coupled to each of the four propeller assemblies, and a PCB configured to be coupled to the base assembly. Each of the four propeller assemblies is configured to rotate about a respective one of a plurality of axes of rotation when the UAV has been assembled. The kit is configured such that when the PCB is coupled to the base assembly, a surface of the PCB lies in a plane defined by the yaw axis and the roll axis, and no portion of the PCB intersects any axis of rotation of any of the four propeller assemblies.

In some embodiments, the kit further comprises a plurality of motors already coupled to, or configured to be coupled to, the four propeller assemblies. In some embodiments, the base assembly comprises a plurality of motors that, after the UAV has been assembled, are coupled to the four propeller assemblies.

In some embodiments, the PCB of the kit has a nonrectangular shape. The nonrectangular shape may be any shape, such as, for example, the shape of an animal (e.g., a shark, a whale, a dog, a cat, a tiger, a fish, etc.).

In some embodiments, at least a portion of the surface of the PCB of the kit is exposed. In some embodiments, at least a portion of the surface of the PCB is covered by a coating, which may be transparent or translucent.

In some embodiments, the PCB of the kit comprises a mechanical feature configured to engage with a peripheral or a peripheral subassembly. For example, the mechanical feature may be a cutout in the PCB. In some such embodiments, the kit includes the peripheral, which may be, for example, a camera. In some embodiments that include a camera, the kit further comprises a protective ring coupled to or configured to be coupled to the camera.

In some embodiments, the combined weight of the four propeller assemblies, the base assembly, and the PCB of the kit is less than 1 kilogram (kg). For example, the kit may be for a micro-drone that, in assembled form, weighs no more than 250 grams (g).

In some embodiments, an unmanned aerial vehicle comprises at least one propeller assembly, a base assembly coupled to the at least one propeller assembly, and a PCB coupled to the base assembly. The PCB comprises a mechanical feature (e.g., a cutout) configured to engage with a peripheral (e.g., a camera) or a subassembly coupled to the peripheral. In some embodiments, the PCB is oriented substantially horizontally when the UAV is at rest. In other embodiments, the PCB is oriented substantially vertically when the UAV is at rest.

In some embodiments, the mechanical feature is a cutout, and the UAV includes the peripheral (e.g., a camera) or a peripheral subassembly, which is slidably engaged in the cutout. In some embodiments, the peripheral is electrically coupled to the printed circuit board. In some embodiments, the peripheral or peripheral subassembly is soldered to the printed circuit board. In some embodiments, in which the peripheral is a camera, the UAV further comprises a protective ring coupled to the camera.

In some embodiments, the printed circuit board has a nonrectangular shape, which may be the shape of an animal (e.g., a shark).

In some embodiments, a weight of the unmanned aerial vehicle is less than 1 kilogram (kg).

In some embodiments, a kit for an unmanned aerial vehicle comprises at least one propeller assembly, a base assembly coupled to or configured to be coupled to the at least one propeller assembly, and a printed circuit board coupled to or configured to be coupled to the base assembly. The printed circuit board comprises a mechanical feature (e.g., a cutout) configured to engage with a peripheral (e.g., a camera). In some embodiments, the kit includes the peripheral (e.g., a camera). In some embodiments, in which the peripheral is a camera, the kit includes a protective ring coupled to or configured to be coupled to the camera.

In some embodiments, the kit includes a plurality of motors coupled to or configured to be coupled to the four propeller assemblies. In some embodiments, the base assembly comprises a plurality of motors.

In some embodiments, the printed circuit board has a nonrectangular shape, which may be the shape of an animal (e.g., a shark).

In some embodiments, at least a portion of the surface of the printed circuit board is covered by a coating, which may be transparent or translucent.

In some embodiments, the combined weight of the at least one propeller assembly, the base assembly, and the PCB of the kit is less than 1 kilogram (kg). For example, the kit may be for a micro-drone that, in assembled form, weighs no more than 250 grams (g).

BRIEF DESCRIPTION OF THE DRAWINGS

Objects, features, and advantages of the disclosure will be readily apparent from the following description of certain embodiments taken in conjunction with the accompanying drawings in which:

FIG. 2 is a perspective left, rear view of an UAV in accordance with some embodiments.

FIG. 3A is a left plan view of an UAV in accordance with some embodiments.

FIG. 3B is a close-up left plan view of a portion of the vertically-oriented printed circuit board of the UAV shown in FIG. 3A.

FIG. 7A is top plan view of an UAV in accordance with some embodiments.

FIG. 7B is a close-up top plan view of a portion of the horizontally-oriented printed circuit board of the UAV shown in FIG. 7A.

FIG. 8A is top plan view of an UAV in accordance with some embodiments.

FIG. 8B is a close-up top plan view of a portion of the horizontally-oriented printed circuit board of the UAV shown in FIG. 8A.

DETAILED DESCRIPTION

Figure 1:
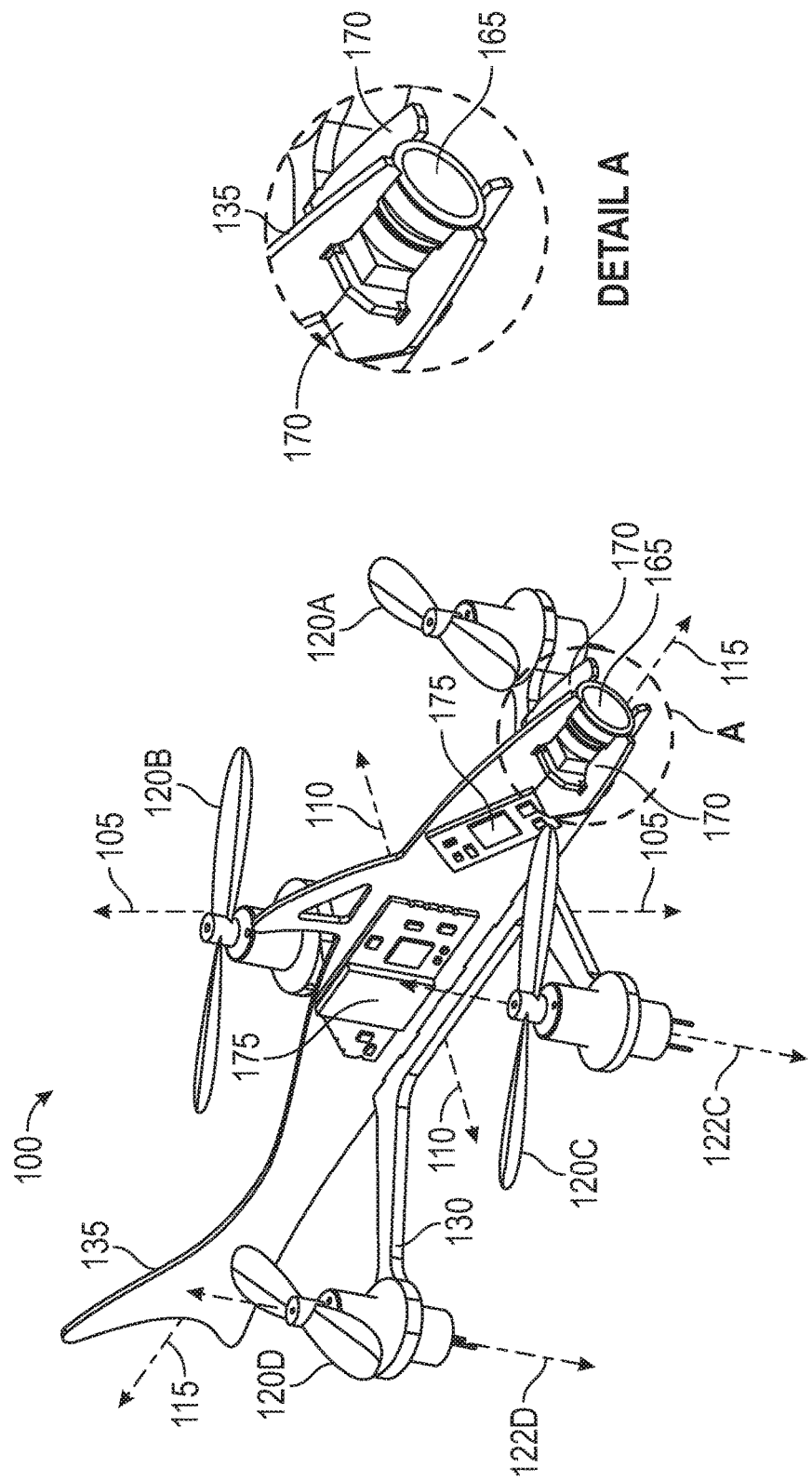
FIG. 1 is a perspective right, front view of an unmanned aerial vehicle (UAV) in accordance with some embodiments.

The detailed description set forth below in connection with the appended drawings is intended as a description of various configurations and is not intended to represent the only configurations in which the concepts described herein may be practiced. The detailed description includes specific details for providing a thorough understanding of various concepts. It will be apparent to those skilled in the art that these concepts may be practiced without these specific details. In some instances, well-known structures and components are shown in block diagram form in order to avoid obscuring such concepts.

Unmanned aerial vehicles (UAVs) are aircraft without an on-board human pilot. UAVs have many uses, including in military, commercial (e.g., package deliveries, land surveys, etc.), scientific, recreational, agricultural, and other applications. One type of UAV is known as a "quadcopter," which has four rotors (also referred to herein as propellers). A UAV may include a camera that provides a first-person view (FPV) of the flight to a remotely-located viewer, such as, for example, the UAV's pilot or an observer. The viewer may view the flight using a display, such as, for example, a headset that presents the first-person view, thereby giving the viewer the sense that he or she is aboard the UAV.

A popular use of UAVs is for FPV drone racing, in which participants (pilots) control drones (e.g., small radio-controlled aircraft or quadcopters) flown through a course. Each pilot's objective is to complete the course as quickly as possible. The drones are equipped with cameras that wirelessly transmit live video streams to displays accessible to the pilots. The display may be, for example, a head-mounted display (e.g., a headset, goggles, etc.). The display shows a live-stream camera feed from the drone being flown by the pilot.

For drone racing and other applications, the flight characteristics of the UAV are important. Both the speed and maneuverability of the UAV can impact the user experience. Therefore, there is an ongoing need for UAV's with improved flight characteristics.

Disclosed herein are UAV designs providing such improved flight characteristics. Some embodiments described herein may provide a UAV with greater maneuverability than conventional UAVs. Some embodiments described herein may provide a UAV with more desirable aerodynamics than conventional UAVs. Some embodiments described herein may provide a UAV with greater modularity of its component parts than conventional UAVs. Based on these and other benefits, embodiments described herein may provide UAVs that better perform existing functions of UAVs and/or allow new uses of UAVs.

Embodiments disclosed herein relate to apparatuses, systems, and methods for UAVs. In particular, some embodiments of UAVs disclosed herein include a vertically-mounted printed circuit board (PCB). With the convention that the ground is horizontal, a vertically-mounted PCB is perpendicular to the ground when the UAV is level and at rest (e.g., on the ground or on another horizontal surface). In contrast, a horizontally-mounted PCB is parallel to the ground when the UAV is level and at rest. As used herein, the term "printed circuit board" (or "PCB") refers to a board that mechanically supports and electrically connects electronic components (including active (e.g., integrated circuits, etc.) and/or passive (e.g., resistors, inductors, capacitors, etc.)) using conductive tracks, pads, and/or other features etched from conductive sheets (typically copper) laminated onto a non-conductive substrate (e.g., silicon oxide, aluminum oxide, FR-4 glass epoxy, etc.). The electronic components may be soldered to the PCB and/or embedded in the substrate. A PCB may be single-sided (with one conductive layer), double-sided (with two conductive layers), or multi-layer (with inner and outer conductive layers). The term "PCB" is used herein to refer to both assembled (i.e., populated with components) and unassembled (i.e., bare) PCBs.

The use of a vertically-mounted PCB in a UAV offers a number of potential advantages. For example, a vertically-mounted PCB improves the stability of the UAV, particularly when the UAV flies or hovers close to surfaces (e.g., the ground) and might otherwise be negatively impacted by ground effect (e.g., vibrations or instabilities caused when rotor tip vortices are disrupted by the ground). A vertically-mounted PCB also helps to stabilize the UAV and helps to prevent or mitigate unintentional rotation when the UAV flies in the forward direction. A vertically-mounted PCB provides advantages similar to those provided by an air-plane's rudder to improve the UAV's tolerance to wind. In addition, a vertically-mounted PCB potentially enables the UAV to fly faster, which may be particularly advantageous for applications such as drone racing. For example, UAVs typically pitch forward during flight, which results in horizontally-mounted PCBs and other components presenting a significant surface area that causes air resistance. By mounting the PCB vertically, this resistance decreases because only the thin edge of the PCB presents a barrier to the air. Most of the air flows around the vertically-mounted PCB when the UAV flies in the forward direction, regardless of whether or how much the UAV pitches forward.

Some embodiments of UAVs disclosed herein include novel peripheral attachment mechanisms that provide a simple, inexpensive way to attach peripherals to the UAV. For example, a PCB (mounted to have any suitable orientation, including horizontally or vertically) of the UAV may include a mechanical feature to allow the connection of a peripheral (e.g., a vision sensor, such as a camera, LIDAR, or other vision system; an audio sensor, such as a microphone or other audio system, etc.) to the UAV. The mechanical feature may be, for example, a cutout in the PCB into which a peripheral or a peripheral subassembly containing the peripheral may be inserted.

The disclosures herein are applicable to UAVs of various sizes. The application of the disclosures herein to small and/or lightweight UAVs or micro aerial vehicles (MAVs) (i.e., miniature UAVs) is specifically contemplated and may be particularly advantageous. In particular, the disclosures herein may be particularly useful for UAVs weighing less than about 1 kilogram (kg).

FIG. 1 is a perspective right, front view of a UAV 100 in accordance with some embodiments, and FIG. 2 is a perspective left, rear view of the UAV 100 in accordance with some embodiments. The UAV 100 is described herein relative to its principal axes, namely the yaw axis 105 (also known as the vertical axis), the pitch axis 110 (also known as the lateral axis), and the roll axis 115 (also known as the longitudinal axis). The yaw axis 105, pitch axis 110, and roll axis 115 intersect at the center of mass 101 of the UAV 100 (not labeled in FIG. 1, but labeled in FIG. 2). The plane coincident with (i.e., intersecting) the roll axis 115 and the pitch axis 110 is considered to be a horizontal plane. The plane coincident with the roll axis 115 and the yaw axis 105 and the plane coincident with the pitch axis 110 and the yaw axis 105 are both considered to be vertical planes. Herein, a plane is said to be "defined by" two specified axes if it is either coincident with those two axes or parallel to the plane that is coincident with those axes.

The UAV comprises a plurality (i.e., at least two) propeller assemblies 120. In the exemplary embodiment of FIGS. 1 and 2, the UAV 100 includes four propeller assemblies: 120A, 120B, 120C, and 120D. Each of the propeller assemblies 120 comprises at least one rotor. In some embodiments, such as illustrated in FIGS. 1 and 2, each propeller assembly 120 includes a pair of rotors facing one another. In other embodiments, the propeller assemblies 120 may include more than two rotors. The propeller assemblies 120 may comprise any suitable materials, such as, for example, plastic, carbon fiber, high-strength steel, a magnesium (Mg) alloy, an aluminum (Al) alloy, polymer composites, or any other suitable (e.g., light-weight) material. When the UAV 100 is in operation, each of the propeller assemblies 120 rotates about an axis of rotation 122. FIG. 1 illustrates only the axes of rotation 122C and 122D for, respectively, the propeller assemblies 120C and 120D. FIG. 3, discussed below, illustrates the axes of rotation 122A and 122B for, respectively, the propeller assemblies 120A and 120B. In some embodiments, the axis of rotation 122 of some or all of the propeller assemblies 120 is parallel to the yaw axis 105. In other embodiments, the axis of rotation 122 of at least one of the propeller assemblies 120 is at an angle to the yaw axis 105. In some embodiments, the axes of rotation 122 of all of the propeller assemblies 120 are at angles to the yaw axis 105, where the angles may be the same or different.

Each of the propeller assemblies 120 optionally may be protected by a propeller guard (not illustrated). If included, the propeller guards may be substantially rigid structures, typically mounted substantially horizontally, that surround the rotors of the propeller assemblies 120 to protect the propeller assemblies 120 in the event of collisions between the UAV 100 and other objects (flying or stationary).

As illustrated in FIGS. 1 and 2, each of the propeller assemblies 120 is coupled to a base assembly 130. The base assembly 130 may include, or be coupled to, four motors oriented, for example, in an "X"- or "H"-shaped pattern. Each motor is coupled to one of the propeller assemblies 120 and provides aerial propulsion to the UAV 100. The speed of revolution of the motors may be controlled by a processor included in the circuitry 175, discussed below. The base assembly 130 may also include, or be coupled to, other elements, including, for example, pads that contact a surface when the UAV 100 is at rest (e.g., not flying). The base assembly 130 may comprise any suitable material, such as, for example, plastic, metal, carbon fiber, polymer composites, PCB, etc. The base assembly 130 may include conductors that provide power and/or other signals (e.g., control signals) to the motors that drive the plurality of propeller assemblies 120. For example, the base assembly may comprise a PCB with traces that supply power and/or control signals to the motors that drive the plurality of propeller assemblies 120.

The UAV 100 also includes a printed circuit board (PCB) 135 coupled to the base assembly 130. In the embodiment illustrated in FIG. 1, the PCB 135 is mounted vertically in a plane defined by the yaw axis 105 and the roll axis 115. Because the PCB 135 is mounted vertically and lies in a plane defined by the yaw axis 105 and the roll axis 115, the PCB 135 does not intersect any (substantially vertical) axis of rotation 122 of any of the propeller assemblies 120 of FIG. 1.

As shown in FIG. 1, the PCB 135 is populated and includes circuitry 175. The circuitry 175 may include components mounted directly to the surface of the PCB 135, and/or the circuitry 175 may be mounted to a daughter card that is coupled to the surface of the PCB 135 (e.g., through a socket or by soldering). The circuitry 175 may include a processor that may use differences in rotational speeds of the motors, and therefore the propeller assemblies 120, to control the flight of the UAV 100. As illustrated in FIG. 1, each propeller assembly 120 is provided facing another propeller assembly 120. Propeller assemblies 120 that face each other may spin in opposite directions to prevent their lifting forces from canceling each other. For example, the propeller assemblies 120A and 120D may spin clockwise while the propeller assemblies 120B and 120C spin counterclockwise, or vice versa.

The circuitry 175 may include, for example, memory to store software run by a processor to control the UAV 100 and/or to communicate (e.g., using additional components, such as a transmitter and receiver) with a remote device (e.g., a display), to store data received from peripherals 165 of the UAV 100, and/or to store commands or instructions received from a remote device (e.g., a remote user control device).

The circuitry 175 may include, for example, communication circuitry enabling the UAV 100 to communicate wirelessly (e.g., using radio-frequency (RF) signals) with a remote user control device (e.g., a device that enables a pilot to control the UAV 100). For example, the circuitry 175 may include a receiver for receiving commands from the remote user control device. In addition or alternatively, the circuitry 175 may include a transmitter for transmitting information to a remote device (e.g., the remote user control device). For example, the circuitry 175 may transmit a live video stream from a camera mounted on the UAV 100 to a remote device. The UAV 100 may also include components in addition to circuitry 175 to enable the UAV 100 to transmit signals to or receive signals from a remote device. For example, the UAV 100 may include an antenna and wiring coupling the antenna to the transmitter/receiver.

In some embodiments, when the UAV 100 is fully assembled (i.e., in finished form, ready to fly), all or a portion of the surface of the PCB 135 is exposed (i.e., visible) in the fully-assembled UAV 100. For example, all or a portion of the surface of the PCB 135 may be covered by a transparent or translucent coating that allows at least some of the circuitry 175 to be seen. In other embodiments, all or a portion of the surface of the PCB 135 is partially or entirely hidden. For example, all or a portion of the surface of the PCB 135 may be covered by an opaque coating, or all or a portion of the PCB 125 may be inside of a housing that obscures the circuitry 175.

In some embodiments, the PCB 135 has a nonrectangular shape. For example, the PCB 135 may have the shape of an animal. As illustrated in FIGS. 1 and 2, the animal may be a shark. Other animal shapes are contemplated and are within the scope of the disclosures herein. In general, the PCB 135 may have any desired shape, such as a regular shape (e.g., a rectangle, square, triangle) or an irregular shape. Thus, the PCB 135 may provide a whimsical design element to the UAV 100.

In some embodiments, the PCB 135 is configured to allow the attachment of various components or devices (e.g., sensor devices) to the UAV 100. For example, the PCB 135 may include a mechanical feature to allow the connection of a peripheral 165 (e.g., a vision sensor, such as a camera, LIDAR, or other vision system; an audio sensor, such as a microphone or other audio system; etc.).

In some embodiments, the UAV 100 includes a peripheral 165. For example, in the embodiment illustrated in FIGS. 1 and 2, the peripheral 165 is a camera. In some embodiments, the peripheral 165 mounts directly to the UAV 100 by engaging with a mechanical feature of the PCB 135. In some embodiments, and as illustrated in FIGS. 1 and 2, the peripheral 165 is included in a peripheral subassembly 170, and the peripheral subassembly 170 is coupled to the UAV 100 (e.g., by engaging with a mechanical feature of the UAV 100, such as a mechanical feature of the PCB 135). In some such embodiments, the peripheral subassembly 170 includes conductive traces printed onto or within the material making up the peripheral subassembly 170. For example, the peripheral subassembly 170 may comprise a PCB. The conductive traces may provide electrical connections between the peripheral 165 mounted in the peripheral subassembly 170 and the circuitry 175 of the UAV 100 when the peripheral subassembly 170 is connected to the UAV 100. For example, the conductive traces may provide power to the peripheral 165 and/or electrical connections between the peripheral 165 and a processor of the circuitry 175.

In the example embodiment of FIGS. 1 and 2, the peripheral subassembly 170 engages with a mechanical feature of the PCB 135, as shown in details A and B. For example, the peripheral subassembly 170 may slide into place in a cutout of the PCB 135. The attachment point or points between the peripheral subassembly 170 and the PCB 135 may provide electrical connections between components of the peripheral subassembly 170 (including the peripheral 165 itself) and the PCB 135. For example, the PCB 135 may include electrical connection points (e.g., to engage with solder pads 180 of the peripheral 165 or peripheral assembly 170), and the peripheral subassembly 170 or the peripheral 165 itself may include corresponding electrical connection points (e.g., solder pads 180) that are configured to align with the electrical connection points of the PCB 135 when the peripheral 165 or peripheral subassembly 170 engages with the PCB 135, thereby creating a closed electrical circuit between the peripheral(s) 165 (e.g., of the peripheral subassembly 170) and the circuitry 175. Thus, signals (e.g., control, data, etc.) and/or power may be transferred between peripherals 165 (e.g., of the peripheral subassembly 170) and the circuitry 175.

In some embodiments, the peripheral 165 is electrically connected to the PCB 135 through a mechanical connection made when the peripheral subassembly 170 engages with the mechanical feature of the PCB 135. For example, the peripheral subassembly 170 may include pins or other contacts that engage with a socket or other component of the PCB 135 when the peripheral subassembly 170 engages with the mechanical feature. In some embodiments, after the peripheral subassembly 170 engages with the mechanical feature, one or more electrical connections are made through a bond or joint (e.g., solder). As another example, the peripheral 165 may be electrically connected to the PCB 135 using a cable or wires. In some embodiments, the connection between the peripheral 165 and the UAV 100 is partially or completely wireless.

The UAV 100 also includes a power source, which may be, for example, a rechargeable battery. In embodiments in which the power source is a rechargeable battery, the battery may be removable to facilitate charging.

FIG. 3A is a left plan view of a UAV 100 in accordance with some embodiments. As shown in FIG. 3A, the surface of the PCB 135 lies in a plane defined by the yaw axis 105 and the roll axis 115. FIG. 3B illustrates the PCB 135 with a mechanical feature (illustrated as a cutout 155) that enables a peripheral subassembly 170 (illustrated as including a camera as the peripheral 165) to be mounted to the UAV 100 (also shown in detail C of FIG. 3A). As shown in FIGS. 3A and 3B, the cutout 155 allows the peripheral subassembly 170 to slide into place laterally (i.e., from the side, perpendicularly to the PCB 135). In the embodiment shown in FIGS. 3A and 3B, the peripheral subassembly 170 has a form factor designed to fit within the cutout 155. The cutout 155 is illustrated in FIGS. 3A and 3B as having a particular shape, but it is to be appreciated that the cutout 155 may have alternative shapes. In general, the cutout 155 may have any suitable shape for engaging with the peripheral subassembly 170 (e.g., the cutout 155 may include a notch, a groove, a partial circle, a dovetail, etc.).

Figure 4:
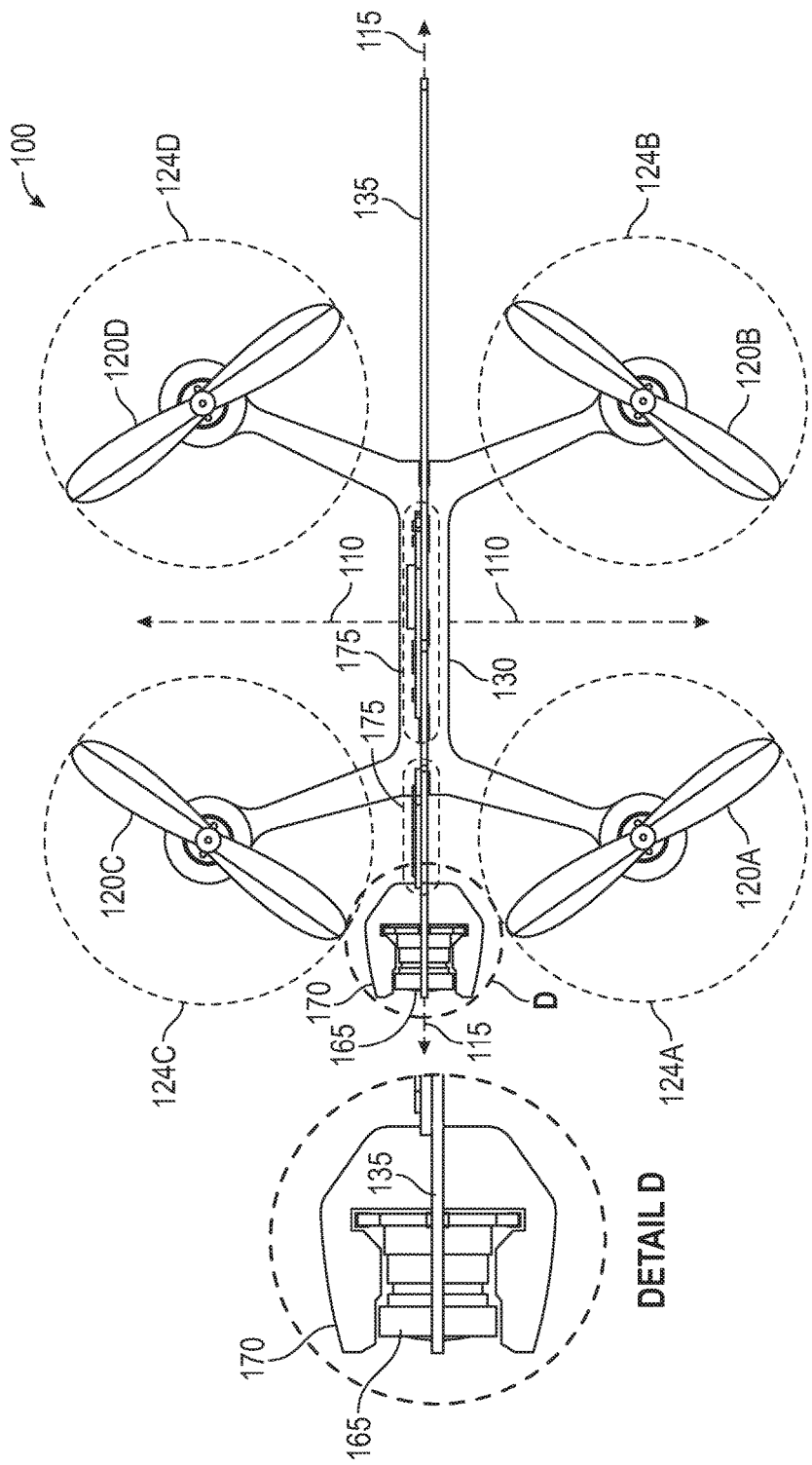
FIG. 4 is a top plan view of an UAV in accordance with some embodiments.

FIG. 4 is a top plan view of a UAV 100 in accordance with some embodiments. In addition to features previously discussed in the context of other drawings herein, FIG. 4 illustrates the rotation circumferences 124 of each of the propeller assemblies 120. Specifically, FIG. 4 illustrates the rotation circumferences 124A, 124B, 124C, and 124D of, respectively, the propeller assemblies 120A, 120B, 120C, and 120D. As shown in FIG. 4, the vertically-mounted PCB 135 does not intersect any of the rotation circumferences 124. Moreover, no surface of the PCB 135 intersects any projection of the rotation circumferences 124 onto any plane that is orthogonal to any of the axes of rotation 122. In other words, if the rotation circumference 124 of any of the propeller assemblies 120A, 120B, 120C, or 120D were projected onto any arbitrary plane that is orthogonal to the corresponding axis of rotation 122A, 122B, 122C, or 122D, the PCB 135 would not intersect the projection.

The detail D of FIG. 4 illustrates the peripheral subassembly 170 in place and engaged with the PCB 135 by the mechanical feature of the PCB 135. The peripheral subassembly 170 may have any shape and configuration suitable to secure the peripheral(s) 165 it contains to the UAV 100. In the embodiment shown in FIGS. 1-4, the peripheral subassembly 170 comprises an element (e.g., a PCB) that, when the peripheral subassembly 170 is engaged with the UAV 100, lies in a horizontal plane. It is to be understood that other peripheral subassembly 170 configurations, sizes, and shapes are also contemplated and are within the scope of the disclosures herein.

Figure 5:
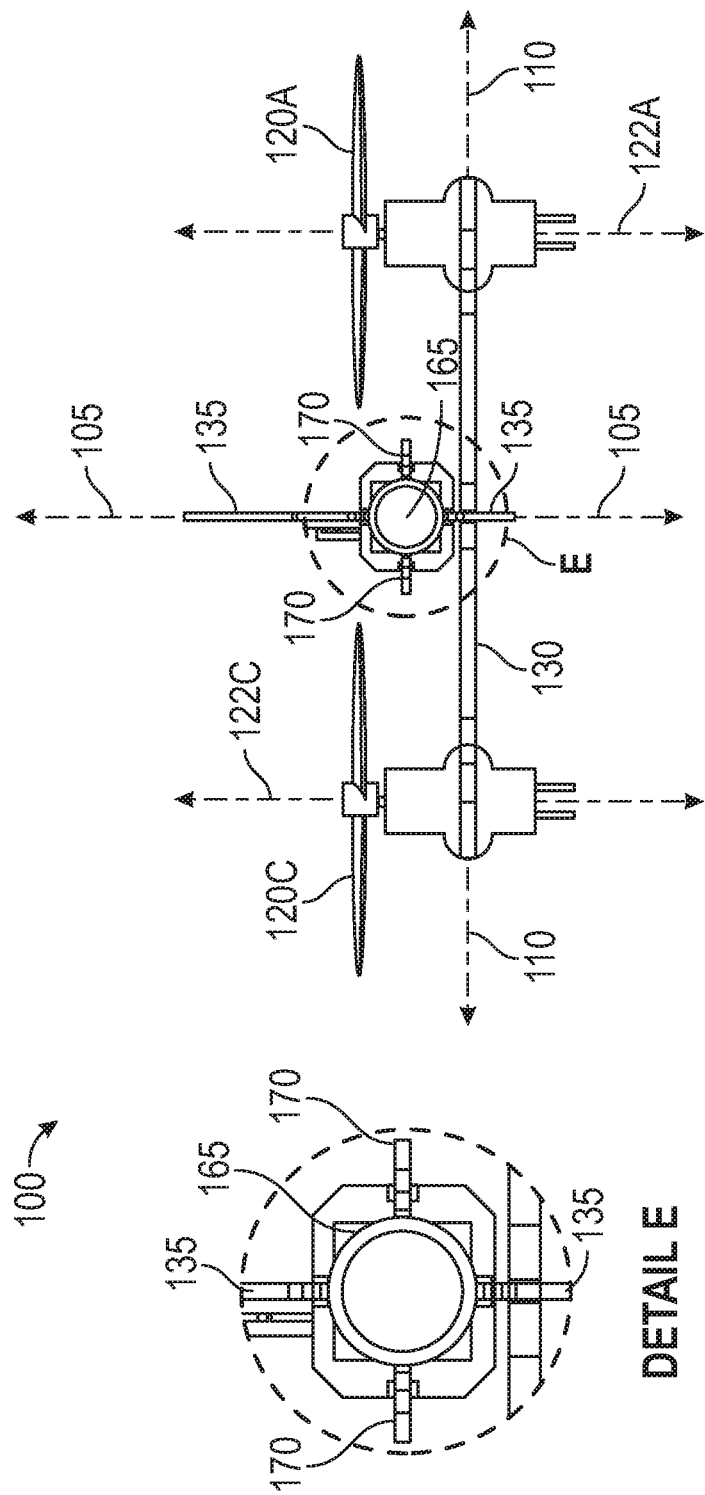
FIG. 5 is a front plan view of an UAV in accordance with some embodiments.

FIG. 5 is a front plan view of a UAV 100 in accordance with some embodiments. As illustrated by FIG. 5 and in detail E, the peripheral subassembly 170, illustrated as having a camera as the peripheral 165, is coupled to the PCB 135. In the embodiment illustrated in FIG. 5, when the peripheral subassembly 170 is engaged with the PCB 135, the top and bottom of the peripheral 165 are secured by the PCB 135, and the left and right of the peripheral 165 are secured by the peripheral subassembly 170. Thus, the combination of the peripheral subassembly 170 and the PCB 135 (with cutout 155) enables the peripheral 165 to be mounted simply and securely to the UAV 100.

Figure 6:
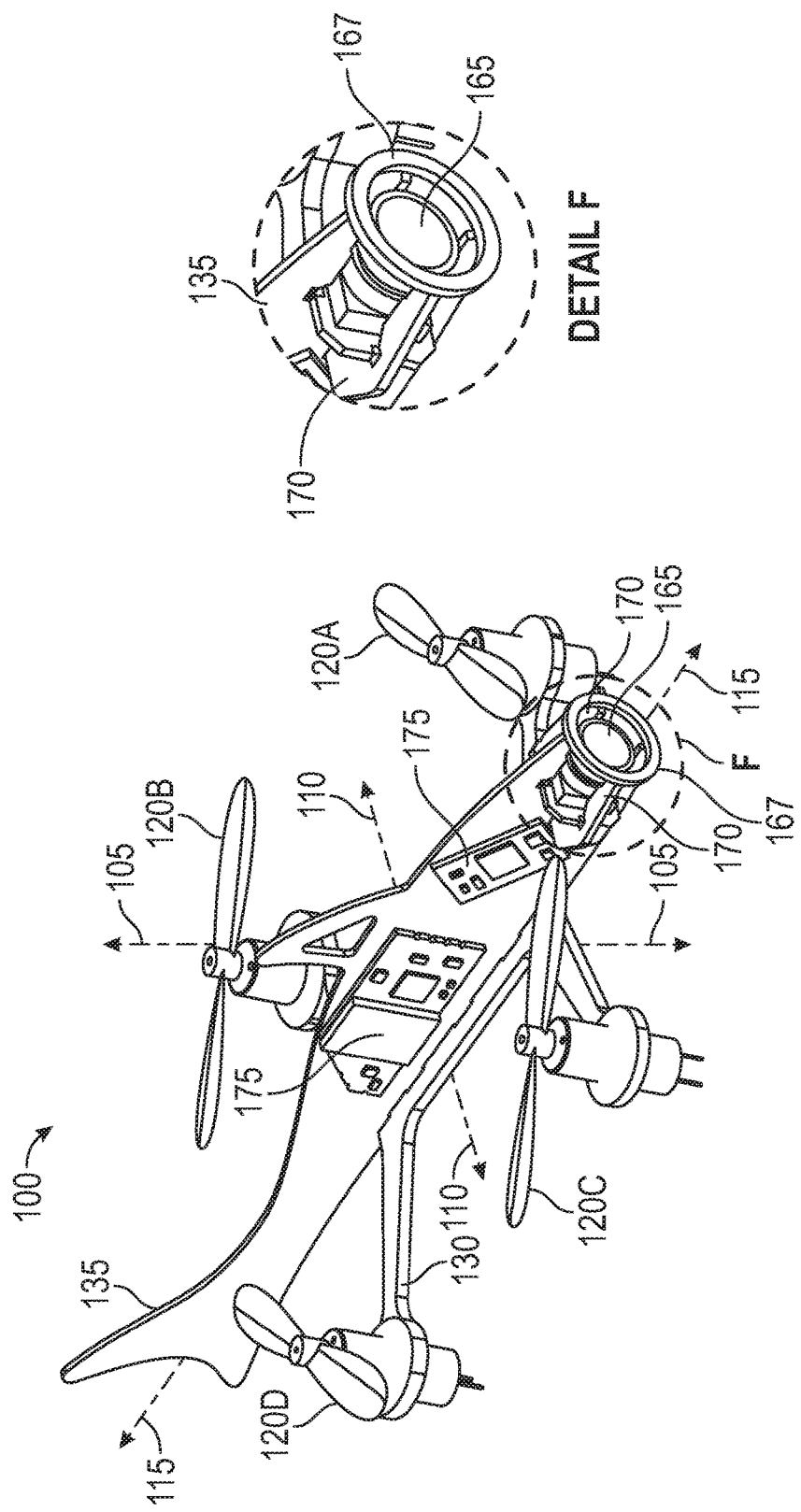
FIG. 6 is a perspective right, front view of an UAV having an optional protective camera ring in accordance with some embodiments.

FIG. 6 is a perspective right, front view of a UAV 100 having an optional peripheral protection device in accordance with some embodiments. In the embodiment of FIG. 6, the peripheral subassembly 170 includes a peripheral 165 that is a camera, and the UAV 100 includes a camera protective ring 167. As illustrated in FIG. 6, the camera protective ring 167 is configured to engage with the peripheral subassembly 170 and/or the PCB 135 to mitigate damage to the camera (e.g., to the lens of the camera) caused by collisions (e.g., with other flying objects or with stationary objects into which the UAV 100 flies). The camera protective ring 167 may be coupled to the peripheral subassembly 170 and/or PCB 135 using any suitable mechanism. For example, the camera protective ring 167 may include a plurality of notches shaped to allow the camera protective ring 167 to slide over protrusions of the peripheral subassembly 170 and/or the PCB 135. As another example, the camera protective ring 167 may be secured to the UAV 100 by adhesive or a fastening mechanism (e.g., a screw, a snap, etc.). The camera protective ring 167 may be made of any suitable material, such as, for example, plastic, metal, carbon fiber, rubber, PCB (in which case it may also provide electrical connectivity), etc. It is to be appreciated that the camera protective ring 167 could alternatively be attached directly to the camera. Moreover, other protective devices may be included to protect other types of peripherals 165 that may be included in the peripheral subassembly 170.

FIGS. 7A and 7B illustrate a UAV 102 in accordance with some embodiments. The UAV 102 includes four propeller assemblies 120A, 120B, 120C, and 120D, a base assembly 130, and some or all of the other elements discussed previously in the description of the UAV 100. In addition, the UAV 102 includes a PCB 135. In the embodiment of the UAV 102 shown in FIGS. 7A and 7B, the PCB 135 has a rectangular shape and is mounted horizontally (i.e., in a plane defined by the pitch axis 110 and the roll axis 115). Although FIG. 7A illustrates a PCB 135 with a rectangular shape, it is to be appreciated that the PCB 135 may have any suitable shape, including regular geometric or irregular shapes. For example, the PCB 135 may have an oval shape, or it may be shaped like an object (e.g., a bird, a fish, a shark, etc.), or it may have any other selected shape that can be coupled to the base assembly 130 and does not interfere with the propeller assemblies 120.

In FIG. 7A, the PCB 135 is illustrated without circuitry 175, but it is to be understood that the PCB 135 may include circuitry 175 (i.e., the PCB 135 is populated), and this circuitry 175 may be as described previously in the discussion of the UAV 100. In some embodiments, when the UAV 102 is fully assembled (i.e., in finished form, ready to fly), all or a portion of the surface of the PCB 135 is exposed (i.e., visible) in the fully-assembled UAV 102. For example, all or a portion of the surface of the PCB 135 may be covered by a transparent or translucent coating that allows at least some of the circuitry 175 to be seen. In other embodiments, all or a portion of the surface of the PCB 135 is partially or entirely hidden. For example, all or a portion of the surface of the PCB 135 may be covered by an opaque coating, or all or a portion of the PCB 125 may be inside of a housing that obscures the circuitry 175.

As shown in the detail G, the PCB 135 includes a mechanical feature, shown as a cutout 155, that enables the peripheral subassembly 170 to be coupled to the PCB 135 (and therefore to the UAV 102). The cutout 155 shown in FIGS. 7A and 7B has a shape that is similar to the shape of the cutout 155 shown in FIGS. 1-6, but it is to be appreciated that the cutout 155 may have a different shape as explained previously. Moreover, although the peripheral 165 is illustrated as a camera, it is to be understood that other peripherals 165 are contemplated and may be coupled to the UAV 102 as described above.

FIGS. 8A and 8B illustrate UAV 103 in accordance with some embodiments. The UAV 103 includes four propeller assemblies 120A, 120B, 120C, and 120D, a base assembly 130, and some or all of the other elements discussed previously in the description of the UAV 100. In addition, the UAV 103 includes a PCB 135. In the embodiment of the UAV 103 shown in FIGS. 8A and 8B, the PCB 135 has a substantially square shape and is mounted horizontally (i.e., in a plane defined by the pitch axis 110 and the roll axis 115) with one corner of the PCB 135 aligned with the roll axis 115, and two corners of the PCB 135 aligned with the pitch axis 110.

In FIG. 8A, the PCB 135 is illustrated without circuitry 175, but it is to be understood that the PCB 135 may include circuitry 175 (i.e., the PCB 135 is populated), and this circuitry 175 may be as described previously in the discussion of the UAV 100. In some embodiments, when the UAV 103 is fully assembled (i.e., in finished form, ready to fly), all or a portion of the surface of the PCB 135 is exposed (i.e., visible) in the fully-assembled UAV 103. For example, all or a portion of the surface of the PCB 135 may be covered by a transparent or translucent coating that allows at least some of the circuitry 175 to be seen. In other embodiments, all or a portion of the surface of the PCB 135 is partially or entirely hidden. For example, all or a portion of the surface of the PCB 135 may be covered by an opaque coating, or all or a portion of the PCB 125 may be inside of a housing that obscures the circuitry 175.

As shown in the detail H, the PCB 135 includes a mechanical feature, shown as a cutout 155, that enables the peripheral subassembly 170 to be coupled to the PCB 135 (and therefore to the UAV 103). The cutout 155 shown in FIGS. 8A and 8B has a shape that is similar to the shape of the cutout 155 shown in FIGS. 1-7, but it is to be appreciated that the cutout 155 may have a different shape as explained previously. Furthermore, although the peripheral 165 is illustrated once again as a camera, it is to be understood that other peripherals 165 are contemplated and may be coupled to the UAV 103 as described above.

Although the drawings herein illustrate a cutout 155 as the mechanical feature enabling a peripheral 165 to be attached to the UAV 100, 102, 103, it is to be understood that other mechanical features may be used instead or in addition to a cutout 155. For example, the mechanical feature may comprise a protrusion, where the protrusion that fits within a cutout, slot, or hole in the peripheral subassembly 170 or peripheral 165; a hook providing a compressive fit with the peripheral subassembly 170 or peripheral 165; a first portion of a joint (e.g., one of two parts of: a ball joint, a bridle joint, an open tenon joint, an open mortise and tenon joint, a tongue and fork joint, a dowel joint, a finger joint, a dovetail joint, dado joint, groove joint, tongue and groove joint, birdsmouth joint, cross lap joint, splice joint, biscuit joint, stitch and glue joint, etc.) that mates with a second portion of the joint on the peripheral subassembly 170 or the peripheral 165 itself; or a first portion of any permanent, semi-permanent, or temporary fastener (i.e., a hardware device that mechanically joins or affixes two or more objects together) that has a suitable size and strength to affix the peripheral subassembly 170 (or the peripheral 165 itself) to the UAV 100, 102, 103.

It is also to be understood that although the drawings herein illustrate a camera as the peripheral 165 in the peripheral subassembly 170, the disclosures apply as well to other peripherals 165 that might be attached to the UAV 100, 102, 103. For example, the peripheral 165 may comprise one or more of: a clock, a timer (e.g., to detect time of flight), lidar, a light source (e.g., an OLED, a bulb, a LED, etc.), a radio transmitter, a Bluetooth module, an altimeter, a temperature sensor, a sample collector (e.g., to collect a sample of fluid, gas, soil, etc.), a mechanical device (e.g., to grip a payload or perform a task), an audio device (e.g., a microphone, a speaker, etc.), an accelerometer, a sensor, etc. In addition, a peripheral subassembly 170 may include or accommodate multiple peripherals 165 (e.g., a camera and an audio device).

It is also to be understood that although the drawings herein illustrate a peripheral subassembly 170, the peripheral 165 may not need such a peripheral subassembly 170. In such cases, the peripheral subassembly 170 and the peripheral 165 are one and the same.

It is also to be understood that although the drawings herein illustrate a UAV 100, 102, 103 in assembled form, the UAV 100, 102, 103 may instead be in the form of a kit that may then be assembled. For example, a kit may include the PCB 135 detached from the base assembly 130. As another example, a kit may provide a fully populated PCB 135 (i.e., the circuitry 175 is attached to or incorporated in the PCB 135), or the PCB 135 may be partially populated or not populated at all (e.g., for a "do it yourself" kit). Likewise, the base assembly 130 may be included in a kit in a partially or fully disassembled form. For example, the base assembly 130 may be provided without the propeller assemblies 120 attached. As another example, a kit may provide the peripheral subassembly 170 separate from the PCB 135. As another example, the propeller assemblies 120 may be in a disassembled form that a user then assembles. A kit may provide separate motors, housing elements, power source (e.g., battery), wiring, peripherals 165, etc. that a user then includes in assembling the UAV 100, 102, 103.

Furthermore, it is to be understood that although the drawings herein illustrate PCBs that are either vertically-mounted or horizontally-mounted, many embodiments do not require vertical or horizontal PCBs. For example, it should be appreciated that UAVs can incorporate the disclosed mechanical features (e.g., cutouts) in PCBs having other orientations than vertical or horizontal (e.g., a PCB 135 could be mounted at a 45 degree angle relative to horizontal and incorporate a mechanical feature (e.g., cutout 155) to couple a peripheral 165 to the UAV).

To avoid obscuring the present disclosure unnecessarily, well-known components of the UAVs 100, 102, 103 (e.g., motors, wireless transmitters and receivers, processors, etc.) are not illustrated and/or discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used herein, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

The term "coupled" is used herein to express a direct connection as well as a connection through one or more intervening parts or structures. Elements that are "communicatively coupled" are capable of communicating but are not necessarily physically coupled. To the extent that the terms "include(s)," "having," "has," "with," and variants thereof are used in the detailed description or the claims, such terms are intended to be inclusive in a manner similar to the term "comprising," i.e., meaning "including but not limited to." The terms "exemplary" and "embodiment" are used to express examples, not preferences or requirements. The term "plurality" means "at least two." The abbreviation "e.g." means "for example." The abbreviation "i.e." means "that is."

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An unmanned aerial vehicle having a yaw axis, a pitch axis, and a roll axis, the unmanned aerial vehicle comprising:
    a plurality of propeller assemblies, each of the plurality of propeller assemblies configured to rotate about a respective one of a plurality of axes of rotation;
    a base assembly coupled to each of the plurality of propeller assemblies; and
    a vertically-mounted printed circuit board coupled to the base assembly, the vertically-mounted printed circuit board comprising a populated surface and an edge substantially perpendicular to the populated surface, wherein:
    the populated surface of the vertically-mounted printed circuit board lies in a first plane, wherein the first plane is coincident with the yaw axis and the roll axis or parallel to a plane coincident with the yaw axis and the roll axis,
    a length of the populated surface of the vertically-mounted printed circuit board along or parallel to the roll axis is greater than a length of the base assembly along the roll axis,
    no portion of the vertically-mounted printed circuit board intersects any of the axes of rotation of the propeller assemblies, and
    for each of the plurality of propeller assemblies, no part of the vertically-mounted printed circuit board intersects any projection, in any second plane orthogonal to the axis of rotation of the propeller assembly, of a rotation circumference of the propeller assembly.

2. The unmanned aerial vehicle recited in claim 1, wherein at least a portion of the populated surface of the vertically-mounted printed circuit board is exposed.

3. The unmanned aerial vehicle recited in claim 1, wherein at least a portion of the populated surface of the vertically-mounted printed circuit board is covered by a coating.

4. The unmanned aerial vehicle recited in claim 3, wherein the coating is transparent or translucent.

5. The unmanned aerial vehicle recited in claim 1, wherein the vertically-mounted printed circuit board has a nonrectangular shape.

6. The unmanned aerial vehicle recited in claim 5, wherein the nonrectangular shape is a shape of an animal.

7. The unmanned aerial vehicle recited in claim 6, wherein the animal is a shark.

8. The unmanned aerial vehicle recited in claim 1, wherein the plurality of propeller assemblies comprises at least four propellers.

9. The unmanned aerial vehicle recited in claim 1, wherein the vertically-mounted printed circuit board comprises a mechanical feature configured to engage with a peripheral or a peripheral subassembly comprising the peripheral.

10. The unmanned aerial vehicle recited in claim 9, wherein the mechanical feature is a cutout.

11. The unmanned aerial vehicle recited in claim 9, wherein the peripheral is a camera.

12. The unmanned aerial vehicle recited in claim 9, wherein the mechanical feature is a cutout, and further comprising the peripheral, and wherein the peripheral or the peripheral subassembly is slidably engaged in the cutout.

13. The unmanned aerial vehicle recited in claim 12, wherein the peripheral is electrically coupled to the vertically-mounted printed circuit board.

14. The unmanned aerial vehicle recited in claim 12, wherein the peripheral or the peripheral subassembly is soldered to the vertically-mounted printed circuit board.

15. The unmanned aerial vehicle recited in claim 12, wherein the peripheral is a camera.

16. The unmanned aerial vehicle recited in claim 15, further comprising a protective ring coupled to the camera.

17. The unmanned aerial vehicle recited in claim 1, wherein a weight of the unmanned aerial vehicle is less than 1 kg.

18. The unmanned aerial vehicle recited in claim 1, wherein:
    at least a portion of the populated surface of the vertically-mounted printed circuit board is exposed,
    the vertically-mounted printed circuit board has a nonrectangular shape, and
    the vertically-mounted printed circuit board comprises a cutout configured to engage with a peripheral or a peripheral subassembly comprising the peripheral.

19. The unmanned aerial vehicle recited in claim 18, wherein the peripheral is a camera, and further comprising the camera, and wherein the camera or the peripheral subassembly comprising the camera is slidably engaged in the cutout.

20. The unmanned aerial vehicle recited in claim 19, further comprising a protective ring coupled to the camera.

* * * * *